United States Patent
Son

(10) Patent No.: US 6,537,927 B1
(45) Date of Patent: Mar. 25, 2003

(54) APPARATUS AND METHOD FOR HEAT-TREATING SEMICONDUCTOR SUBSTRATE

(75) Inventor: Jeong Hwan Son, Daejon (KR)

(73) Assignee: Hynix Semiconductor, Inc., Kyoungki-do (KR)

( * ) Notice: Subject to any disclaimer, the term of this patent is extended or adjusted under 35 U.S.C. 154(b) by 0 days.

(21) Appl. No.: 09/324,657

(22) Filed: Jun. 3, 1999

(30) Foreign Application Priority Data

Nov. 4, 1998 (KR) ............................................. 98-47106

(51) Int. Cl.[7] ........................... H01L 21/00; H01L 21/89
(52) U.S. Cl. ...................... 438/771; 438/165; 438/308; 438/776; 438/778; 438/798; 438/799; 250/492.22; 34/267
(58) Field of Search ................................ 438/165, 275, 438/308, 771, 776, 788, 798, 799; 250/492.22; 34/267

(56) References Cited

U.S. PATENT DOCUMENTS

| 5,628,564 | A | | 5/1997 | Nenyei et al. ............... 374/121 |
|---|---|---|---|---|
| 5,892,886 | A | * | 4/1999 | Sandhu ........................ 392/416 |
| 5,938,839 | A | * | 8/1999 | Zhang .......................... 117/104 |
| 6,044,203 | A | * | 3/2000 | Dawson et al. .............. 392/416 |
| 6,232,207 | B1 | * | 5/2001 | Schindler ..................... 438/562 |
| 6,297,135 | B1 | * | 10/2001 | Talwar ......................... 438/592 |
| 6,319,759 | B1 | * | 11/2001 | Furukawa et al. ........... 438/151 |
| 6,426,277 | B1 | * | 7/2002 | Bae et al. ..................... 438/522 |

FOREIGN PATENT DOCUMENTS

| JP | 7-66193 | * | 3/1995 |
|---|---|---|---|
| JP | 8-76354 | * | 3/1996 |

* cited by examiner

Primary Examiner—Stephen D. Meier
Assistant Examiner—Jeff B Vockrodt
(74) Attorney, Agent, or Firm—Birch, Stewart, Kolasch & Birch, LLP

(57) ABSTRACT

A method and apparatus for heat-treating a semiconductor substrate to heat different areas of the substrate at different temperatures. The method includes using an apparatus having a chamber of a refractory material; a support plate located at a lower side in the chamber for supporting the semiconductor substrate; a heating device disposed at an upper side in the chamber; and, a heat resistance mask provided between the support plate and fabricated to have different heat transmission rates therein.

15 Claims, 2 Drawing Sheets

APPARATUS AND METHOD FOR HEAT-TREATING SEMICONDUCTOR SUBSTRATE

BACKGROUND OF THE INVENTION

1. Field of the Invention

The present invention relates to a semiconductor, and more particularly to an apparatus and a method for heat-treating a semiconductor substrate, capable of applying different temperatures to a substrate.

2. Description of the Conventional Art

Studies for integrated semiconductor devices in which various function devices are integrated on a semiconductor substrate have been performed. For example, a system on chip into which a logic device such as a micro controller unit (MCU) and a memory device such as a random access memory (RAM) are composed is one of the integrated semiconductor devices. Therefore, semiconductor devices which have different electric properties are fabricated on a single semiconductor substrate, and thus the semiconductor substrate requires a heat treatment with different heat treatment conditions (temperatures) in the semiconductor device fabrication process.

More specifically, when forming a source and a drain, a heat treatment is required for impurity diffusion after impurity implantation. Here, the optimum heat-treatment temperature in a memory cell unit is 1000° C., while the optimum temperature in a logic unit is 900° C. Thus, the impurity implantation and diffusion process of the memory cell cannot be concurrently performed with that of the logic unit, but such process should be performed Mice as in which the source and drain of the memory cell has to be formed first and followed by forming the source and drain of the logic unit.

Further, to fabricate transistors which have different threshold voltages on the same semiconductor substrate, it is necessary to make a gate oxidation film of which portions have different thickness, which requires a heat treatment (heat oxidation) to thereby control portions of the semiconductor substrate to have different temperatures. That is, in general the gate oxidation film is formed by which high-purity oxygen is implanted into a silicon substrate and a heat treatment is applied thereto. Here, the higher the temperature of the semiconductor substrate becomes, the more rapid the growth speed of the oxidation film becomes. On the other hand, the lower the temperature of the semiconductor substrate becomes, the slower the growth speed of the oxidation film becomes.

A process of forming a film (a gate oxidation film) of which portions have different thickness on the conventional semiconductor substrate with the same material will be described as follows. First, FIG. 1 is a schematic diagram of a conventional heat-treating apparatus. As shown therein, a wafer holder 102 for supporting a semiconductor substrate or a wafer 101 is placed at a lower side in a chamber 100 and halogen lamps 103 serving as a heating device are provided at an upper side therein, wherein a source gas is flowed from one side of the chamber 100, as in the direction of the arrow in FIG. 1, to the other side thereof.

In the process of forming the oxidation film via a rapid heat-treatment, a growth rate of the oxidation film is affected by the temperature of the substrate. In other words, as the temperature of the substrate increases, the oxidation rate also increases, while as the temperature thereof decreases, the oxidation rate slows down. Therefore, when forming the heat-oxidation film by using the conventional heat-treatment apparatus, the semiconductor substrate 101 uniformly receives the heat as a whole from the heating device, which results in the formation of the film with the uniform thickness on the semiconductor substrate 101. Accordingly, there is required an additional process to form a heat oxidation film of which portions have different thickness on the same semiconductor substrate, which will be described as follows.

More specifically, in FIG. 2A, using the conventional heat-treatment apparatus in FIG. 1, a thick oxidation film 201 is formed on an entire surface of the semiconductor substrate in a relatively high temperature condition. After forming a photoresist film on the oxidation film 201, a photoresist pattern 202 is formed by patterning the photoresist film so that the photoresist film remains on an area where an oxidation film is to be thickly formed, and a portion of the thick oxidation film 201 that the oxidation film is to be thinly formed is removed. The resultant pattern is shown in FIG. 2. Then, as shown in FIG. 2C, on a bare surface of the semiconductor substrate 101 from which the thick oxidation film 201 has been removed, an oxidation film 203 which is thinner than film 201 is formed at a relatively low temperature, and then the photoresist pattern 202 remaining on the thick oxidation film 201 is removed by a plasma ashing method. Eventually, as shown in FIG. 2C, the oxidation film having the portions 201, 203 with different thicknesses is formed on the single semiconductor substrate 101.

In the conventional heat-treatment process, therefore, the semiconductor substrate is composed of an area A and an area B, and the areas A, B should be heat-treated at different temperatures. Accordingly, for example, the area A is protected with a mask such as the photoresist pattern and the area B is only heat-treated at an optimum temperature, and then the area A is heat-treated at an optimum temperature with the area B being protected with the mask, which requires several heat-treatment processes. Thus, the conventional process for fabricating the semiconductor device is complicated, the semiconductor substrate intensively receives thermal stress and a throughput of semiconductor device fabrication unavoidably decreases.

Further, the conventional process, for forming a gate oxidation film of which portions have different thicknesses on a single semiconductor substrate, is quite complicated due to the additional processes such as a photolithography, an etching and a rinsing. Also, due to the plasma ashing performed to remove a photoresist film after performing the photolithography process, the oxidation film is damaged which results in degradation of the film property and thus deterioration of the reliability of the semiconductor device fabricated by using the thusly formed oxidation film.

SUMMARY OF THE INVENTION

Accordingly, the present invention is directed to an apparatus and a method for heat-treating a semiconductor substrate which obviates the problems and disadvantages due to the conventional art.

An object of the present invention is to provide an apparatus and a method for heat-treating a semiconductor substrate capable of heat-treating a semiconductor substrate in which portions have different optimum heat-treating conditions by a single heat treatment process, as well as satisfying the optimum heat-treating conditions.

Another object of the present invention is to provide an apparatus and a method for heat-treating a semiconductor substrate that form a film on the semiconductor substrate of which portions have different thickness.

Still another object of the present invention is to provide an apparatus and a method for heat-treating a semiconductor substrate that facilitate a semiconductor device fabricating process by omitting other processes which are necessary to the conventional art, such as a photolithography, an etching, a plasma ashing and a rinsing processes, as well as form an oxidation film of good quality.

To achieve these and other advantages and in accordance with the purpose of the present invention, as embodied and broadly described, an apparatus for heat-treating a semiconductor substrate includes a chamber of a refractory material, a support plate located at a lower side in the chamber for supporting the semiconductor substrate, a heating device disposed at an upper side in the chamber, and a heat resistance mask provided between the support plate and fabricated to have different heat transmission rates of portions thereof.

It is to be understood that both the foregoing general description and the following detailed description are exemplary and explanatory and are intended to provide and further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to the preferred embodiments of the present invention, examples of which are illustrated in the accompanying drawings.

Figure 1:
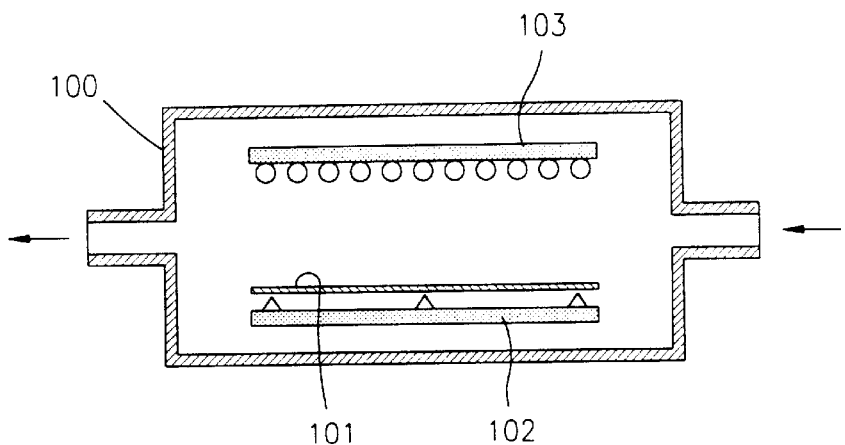
FIG. 1 is a schematic diagram of a conventional heat-treatment apparatus.
Figure 2A:
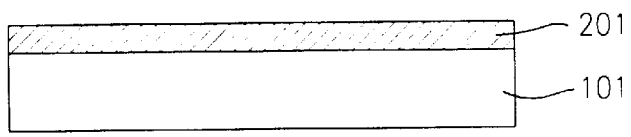
FIGS. 2A–2C are diagrams sequentially illustrating a process for forming a thin film by using the conventional heat-treatment apparatus.
Figure 2B:
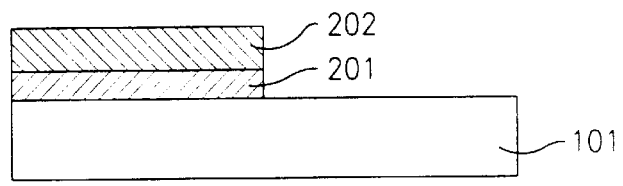
Figure 2C:
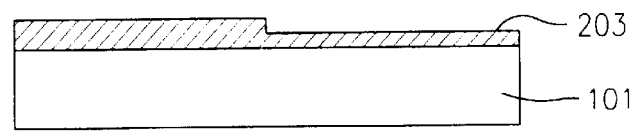
Figure 3:
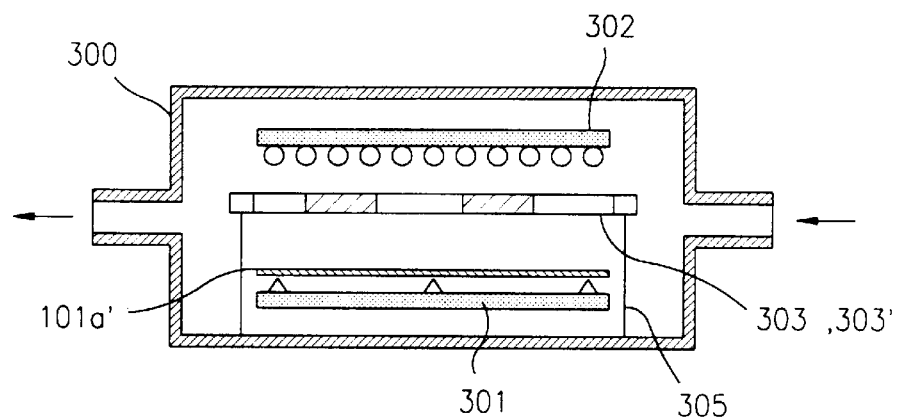
FIG. 3 is a schematic diagram of a heat-treatment apparatus according to the present invention.

As shown in FIG. 3, in a heat-treatment apparatus according to the present invention there are provided a chamber 300 which is formed of a heat-resistant material such as quartz, a support plate 301 provided at a lower side in the chamber 300 and a heating device 302 such as a halogen lamp located above the support plate 301. Additionally, a heat resistance mask 303 is disposed between the support plate 301 and the heating device 302, the mask 303 having a predetermined pattern of which portions have different heat transmission rates in accordance with the thickness thereof and being fixed to a bottom of the chamber 300 by support props 305. Further, a semiconductor substrate 101 a is arranged on the support plate 301.

Figure 4A:
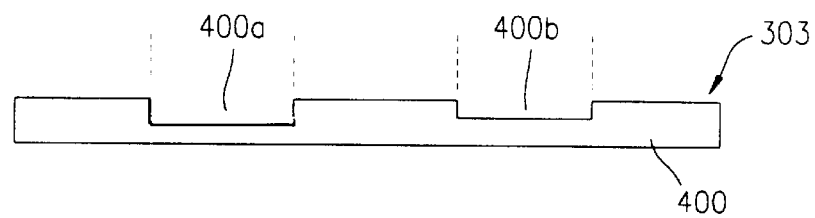
FIGS. 4A and 4B are detail diagrams of a heat resistance mask in FIG. 3.
Figure 4B:
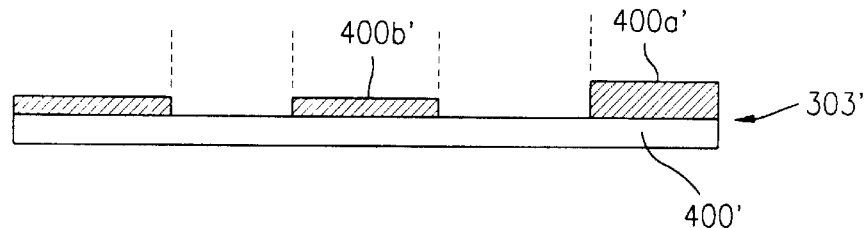

FIGS. 4A and 4B illustrate the heat resistance mask 303 in more detail.

As shown FIG. 4A, the heat resistance mask 303 includes a quartz substrate 400 which includes a plurality of cave-in portions 400a, 400b. Since the cave-in portions 400a, 400b are formed thinner than the other portions which are not caved, the heat transmission rate thereof is higher than the other portions. In addition, the cave-in portion 400a which has a deeper caveOin than the portion 400b has a faster heat transmission rate. Since the heat resistance mask 303 is disposed between the heating device 302 and the semiconductor substrate 101a which is located above the support plate 301, the heat transmission rate to the semiconductor substrate varies, whereby an entire surface of the semiconductor substrate does not receive the uniform temperature and the portions of the substrate have different temperatures. In such condition, by which a predetermined gas is flowed into the chamber 300 and the heat treatment is applied thereto, the semiconductor substrate can be partially heat-treated by the single process at an optimum temperature.

As described above, when in the semiconductor substrate, high heat-treated portions and low-heat-treated portions are determined, a heat resistance mask having cave-in portions which are formed in accordance with the above portions is fabricated and placed in the chamber 300.

While FIG. 4A illustrates the mask, which has the cave-in portions at the quartz substrate, for regulating the heat transmission to the semiconductor substrate, the heat transmission rate of the mask can be differed by an alternative method as shown in FIG. 4B.

More specifically, a heat resistance mask 303' is provided by forming mask patterns 400a', 400b' on a thinly provided quartz substrate 400' to reduce the heat transmission rate. Here, it is noted that the thickness of the mask patterns 400a', 400b' is adjusted according to a desirable temperature in consideration of the heat resistance coefficient of the material of the mask pattern. As the material of the mask patterns 400a', 400b' an insulating material such as an oxide and a nitride, or a refractory metal such as tungsten can be applied.

Further, in FIG. 3, it is noted that a distance between the heat resistance mask 303, 303' and the semiconductor substrate 101a is preferably within 5 cm, because as being kept distant from the mask, the temperature distinction between the portions having the mask patterns and the other portion without the mask patterns becomes unclear. Accordingly, the mask pattern should not be over-distanced from the semiconductor substrate.

A method for heat-treating the semiconductor substrate according to the present invention by using the heat-treatment apparatus shown in FIG. 3 will be described as follows.

First, the semiconductor substrate 101a is placed on the support props 305 the chamber 300, and an inert gas such as $N_2$ or Ar is flowed into the chamber 300. Next, a heat treatment for the semiconductor substrate 101a is performed at a temperature of 800–1100° C. for 5–30 seconds by operating the heat-treatment apparatus. Here, when the above-described heat treatment is performed after implanting impurities into the semiconductor substrate, impurity layers which have sectionally different impurity diffusion profiles can be obtained in the substrate.

In addition, there is an alternative method for heat-treating the semiconductor substrate according to the present invention by using the heat-treatment apparatus of FIG. 3. That is, after placing the semiconductor substrate 101a on the support props in the chamber 300 of the apparatus, a high-purity oxygen gas which is obtained by electrolysis is flowed into the chamber 300 under 1000 sccm, and then a heat treatment for the semiconductor substrate 101a is performed at a temperature of 800–1100° C. for 5–30 seconds by operating the heat-treatment apparatus to thereby form a heat-oxidation film at a thickness of about 20–100 Å on the semiconductor substrate 101a. That is, since the heat-oxidation film is thickly formed on portions of the substrate 101a having a high temperature and relatively thinly formed on the other portions of the substrate 101a having a low temperature, it is possible to obtain the oxidation film which is formed at an irregular thickness by the single heat-treatment (the heat-oxidation) process.

The apparatus and method for the heat treatment for the semiconductor substrate according to the present invention has several advantages. Since it is possible to perform heat-treating a semiconductor substrate of which portions require different optimum temperatures by a single heat-treatment process in accordance with the present invention, a throughput of semiconductor device fabrication can be improved. In addition, since the single heat-oxidation process is performed to form a film on the semiconductor substrate of which portions have different thickness, other processes which are necessary to the conventional art are not required for the present invention, thus facilitating the fabricating process. Further, by omitting a plasma ashing process which is carried out after forming a thick oxidation film in the conventional art, the present invention prevents the film formed on the semiconductor substrate from being damaged, thereby improving the reliability of the semiconductor device.

It will be apparent to those skilled in the art that various modifications and variations can be made in the apparatus and method for heat-treating the semiconductor substrate of the present invention without departing from the spire or scope of the invention. Thus, it is intended that the present invention cover the modifications and variations of this invention provided they come within the scope of the appended claims and their equivalents.

What is claimed is:

1. An apparatus for heat-treating a semiconductor substrate, comprising:
   a chamber of a refractory material;
   a support plate located at a lower side in the chamber for supporting the semiconductor substrate;
   a heating device disposed at an upper side in the chamber; and
   a heat resistance mask provided between the support plate and heating device, the mask fabricated to have at least three different heat transmission rates therein.

2. The apparatus according to claim 1, wherein a distance between the support plate and the heat resistance mask is within 5 cm.

3. The apparatus according to claim 1, wherein the heat resistance mask is formed of a quartz substrate having a plurality of cave-in portions of different depth.

4. The apparatus according to claim 1, wherein the heat resistance mask is formed a quartz substrate on which a plurality of mask patterns are formed, the mask patterns having different thickness.

5. The apparatus according to claim 4, wherein the mask patterns is made of an insulating material or a refractory metal.

6. The apparatus according to claim 5, wherein the insulating material is an oxide or a nitride.

7. The apparatus according to claim 5, wherein the refractory metal is tungsten.

8. The apparatus according to claim 1, wherein the heating device is a halogen lamp.

9. An apparatus for heat-treating a semiconductor substrate, comprising:
   a chamber of a refractory material;
   a support plate located at a lower side in the chamber for supporting the semiconductor substrate;
   a heating device disposed at an upper side in the chamber; and
   a heat resistance mask provided between the support plate and fabricated to have at least three different heat transmission rates therein,
   wherein the heat resistance mask is supported by supporting props fixed to a bottom of the chamber.

10. In a method for heat-treating a semiconductor substrate by using an apparatus for heat-treating a semiconductor substrate which includes a chamber isolating an interior from an exterior, a support plate located at a lower side in the chamber for supporting the semiconductor substrate, a heating device disposed at an upper side in the chamber, and a heat resistance mask provided between the support plate and the heating device and having mask patterns which have at least three different heat transmission rates, the method comprising:
   placing the semiconductor substrate on the support plate;
   introducing a predetermined gas into the chamber; and
   operating the heating device for a predetermined time, so that temperatures of sections of the semiconductor substrate range between 800–1100° C.

11. The method according to claim 10, wherein the predetermined time is between 5–30 seconds.

12. The method according to claim 10, wherein the predetermined gas is a $N_2$ or Ar gas.

13. The method according to claim 10, wherein the predetermined gas is an oxygen gas.

14. The method according to claim 13, wherein the oxygen gas is introduced into the chamber at about 1000 sccm.

15. The method according to claim 13, wherein the heat-treating method is for forming an oxidation film of which seasons have different thickness on the semiconductor substrate.

* * * * *